United States Patent [19]

Mitani et al.

[11] Patent Number: 5,019,524
[45] Date of Patent: May 28, 1991

[54] METHOD OF MANUFACTURING A HETEROJUNCTION BIPOLAR TRANSISTOR

[75] Inventors: Katsuhiko Mitani, Kokubunji; Tomonori Tanoue, Ebina; Chushiro Kusano, Tokorozawa; Masayoshi Kobayashi, Hachioji; Susumu Takahashi, Tokyo, all of Japan

[73] Assignee: Hitachi, Ltd., Tokyo, Japan

[21] Appl. No.: 401,506

[22] Filed: Aug. 30, 1989

Related U.S. Application Data

[62] Division of Ser. No. 233,010, Aug. 17, 1988, abandoned.

[30] Foreign Application Priority Data

Aug. 24, 1987 [JP] Japan .................. 62-208109

[51] Int. Cl.$^5$ ................ H01L 21/20; H01L 21/265
[52] U.S. Cl. ..................................... 437/31; 437/126; 437/133; 437/909; 148/DIG. 10; 148/DIG. 72; 148/DIG. 84
[58] Field of Search .............. 437/31, 32, 33, 133, 437/909, 915, 22, 126; 148/DIG. 11, DIG. 72, DIG. 10, DIG. 84; 357/16, 34

[56] References Cited

U.S. PATENT DOCUMENTS

| | | | |
|---|---|---|---|
| 4,586,071 | 4/1986 | Tiwari | 148/DIG. 10 |
| 4,593,305 | 6/1986 | Kurata et al. | 437/126 |
| 4,617,724 | 10/1986 | Yokoyama et al. | 437/126 |
| 4,679,305 | 7/1987 | Motizuka | 357/34 |
| 4,746,626 | 5/1988 | Eda et al. | 437/909 |
| 4,766,092 | 8/1988 | Kuroda et al. | 437/126 |
| 4,872,040 | 10/1989 | Jackson | 357/16 |

FOREIGN PATENT DOCUMENTS

| | | | |
|---|---|---|---|
| 101739 | 2/1983 | European Pat. Off. | |
| 166823 | 10/1985 | European Pat. Off. | |
| 0184016 | 7/1986 | European Pat. Off. | 357/34 |
| 0216155 | 4/1987 | European Pat. Off. | 357/34 |
| 288681 | 2/1988 | European Pat. Off. | |
| 307850 | 9/1988 | European Pat. Off. | |
| 61-91959 | 5/1986 | Japan | 357/34 |
| 61-102774 | 8/1986 | Japan | 357/34 |

OTHER PUBLICATIONS

Bailbe et al., "111 V Heterojunction Bipolar Transistors", Solid State Electronics, vol. 30, No. 11, pp. 1159-1169, 1987.

Primary Examiner—Brian E. Hearn
Assistant Examiner—Tuan Nguyen
Attorney, Agent, or Firm—Antonelli, Terry, Stout & Kraus

[57] ABSTRACT

Disclosed is a semiconductor device including a heterojunction bipolar transistor in which the front surface of a base layer and the surface of an emitter-base junction are covered with a high-resistivity layer of compound semiconductor containing at least one constituent element common to an emitter layer and the base layer.

32 Claims, 3 Drawing Sheets

METHOD OF MANUFACTURING A HETEROJUNCTION BIPOLAR TRANSISTOR

This application is a divisional application of application Ser. No. 07/233,010, filed Aug. 17, 1988.

BACKGROUND OF THE INVENTION

The present invention relates to a bipolar transistor employing a heterojunction, and a method of manufacturing the same.

A bipolar transistor utilizing a heterojunction such as of GaAs/AlGaAs can raise the impurity concentration of a base layer without incurring degradation in the current gain. As a result, a lower base resistance can be realized with the base layer thinner than in conventional transistors, and a high-speed operation becomes possible.

FIG. 3 shows a schematic sectional view of a mesa type heterojunction bipolar transistor in a prior art. Usually, such a device is fabricated in the following way: An n+-type GaAs collector contact layer 32, an n-type GaAs collector layer 33, a p+-type GaAs base layer 34, an n-type AlGaAs emitter layer 35 and an n+-type GaAs emitter contact layer 36 are successively stacked and grown on a semi-insulating GaAs substrate 31 by MBE (molecular-beam epitaxy) or the like. Thereafter, the surfaces of the base layer 34 and the collector contact layer 32 are exposed by mesa etching, and electrodes 37, 38 and 39 respectively corresponding to an emitter, a base and a collector are formed. Then, the device is finished up.

For the high speed operation of the heterojunction bipolar transistor, it is very important to further lower the external base resistance and to reduce the base-collector capacitance. To these ends, it is effective to microfabricate the device and to shorten the interelectrode distances thereof. The microfabrication of the device, however, brings about the problem that the D.C. current gain of the device lowers with reduction in the emitter size thereof (the emitter size effect), as discussed in, for example, Japanese Journal of Applied Physics, Vol. 24, No. 8 (1985), pp. L596–L598. When an SiN film formed by sputtering is employed as a protective film, the emitter size effect mitigates as compared with those in the cases of other protective films ($SiO_2$ films produced by sputtering and CVD (chemical vapor deposition)). In practical use, however, the emitter size effect needs to be relieved still more.

SUMMARY OF THE INVENTION

The prior art stated above has had the problem that the lowering of the current gain attendant upon the microfabrication of the device (the emitter size effect) cannot be sufficiently relieved.

An object of the present invention is to remarkably relieve the emitter size effect.

The object can be accomplished in such a way that the surface of a base layer and the surface of an emitter-base junction are covered with a high-resistivity layer, especially a high-resistivity epitaxial layer, made of a compound semiconductor which is of the same sort as the compound semiconductors of emitter and base layers, that is, which contains at least one constituent element common to the emitter and base layers.

More concretely, in a compound-semiconductor bipolar transistor having a structure in which a collector layer, a base layer and an emitter layer are successively stacked on a semiconductor substrate; a semiconductor device according to the present invention is so constructed that said base layer includes an inner base region on which said emitter layer is placed in an identical plan shape, and an outer base region which is other than said inner base region, that the periphery of a p-n junction region defined between said inner base region and said emitter layer, and a part of a front surface of said outer base region as surrounds said p-n junction are covered with a compound-semiconductor high-resistivity layer which contains at least one element contained in both said emitter layer and said base layer as a constituent element thereof, that a base contact layer which is made of a compound semiconductor having the same conductivity type as that of said base layer is formed on a part of said outer base region not overlaid with said compound-semiconductor high-resistivity layer, and that a base electrode is formed on said base contact layer.

It has been revealed that, by covering the surface of the base and the surface of the emitter-base junction with the compound-semiconductor high-resistivity layer, the D.C. current gain ($h_{FE}$) of the transistor becomes greater than in the case of the SiN protective film, so the emitter size effect can be relieved still more. This is interpreted as follows: Since the compound-semiconductor high-resistivity layer contains the constituent element common to both the base layer and the emitter layer as described above, the lattice constant thereof is substantially equal to those of the base layer and emitter layer. Accordingly, the surface state density of the high-resistivity layer at the interfaces thereof with the base layer and emitter layer become much lower than in the case of the SiN film having heretofore been used. As a result, recombination currents in the base surface and the emitter-base junction surface decrease remarkably.

In addition, by providing the base electrode through the compound-semiconductor high-resistivity layer made of, for example, the high-resistivity epitaxial layer, the parasitic capacitances between the emitter and the base and between the collector and the emitter can be decreased. Thus, a high-speed operation can be performed.

Moreover, according to the semiconductor device of the present invention, the base contact layer and the compound-semiconductor high-resistivity layer can be formed so as to be substantially even with the emitter layer (or an emitter contact layer if formed), and a planar structure implemented with an Si device can be realized so as to facilitate integration. Further, the formation of the base contact layer can lower, not only the contact resistance of the base region relative to the base electrode, but also the D.C. resistance between the base electrode and the base region, so that the resistance of the base can be lowered.

DETAILED DESCRIPTION OF THE PREFERRED EMBODIMENTS

Figure 1A:
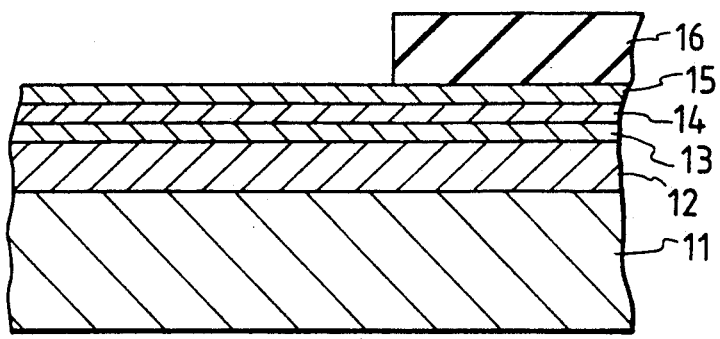
FIGS. 1(a)–1(g) are processing sectional views of a semiconductor device in Embodiment 1 of the present invention.

Embodiment 1: This embodiment will be described with reference to processing sectional views shown in FIGS. 1(a)-1(g).

On an n+-type GaAs substrate 11, and using MBE or the like, there are successively stacked and grown an n-type GaAs collector layer 12 having a thickness of about 4000-5000 Å, a p+-type GaAs base layer 13 having a thickness of about 500-1000 Å, an n-type AlGaAs emitter layer 14 having a thickness of about 1000 Å, and an n+-type GaAs emitter contact layer 15 having a thickness of about 1000 Å. Thereafter, using conventional CVD and lithographic techniques, an SiN film mask 16 which corresponds to the shape of an emitter pattern is formed on the emitter contact layer 15 (FIG. 1(a)).

Figure 1B:
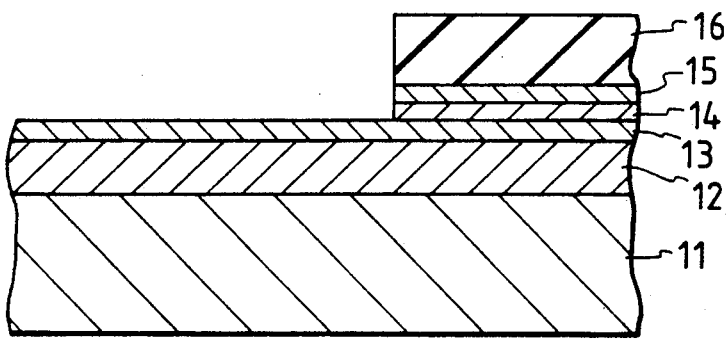

Subsequently, an emitter region which is made up of the n+-type GaAs emitter contact layer 15 and the n-type AlGaAs layer 14 is formed using the SiN film mask 16 and by dry etching with $CF_4$ or the like (FIG. 1(b)).

Figure 1C:
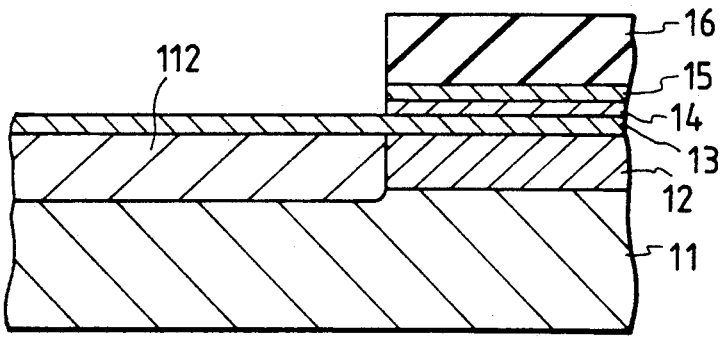

At the next step, any of proton, boron and oxygen is ion-implanted using the SiN film mask 16, whereby the part 112 of the collector layer 12 underlying the outer base region of the base layer 13 is rendered insulating (FIG. 1(c)).

Figure 1D:
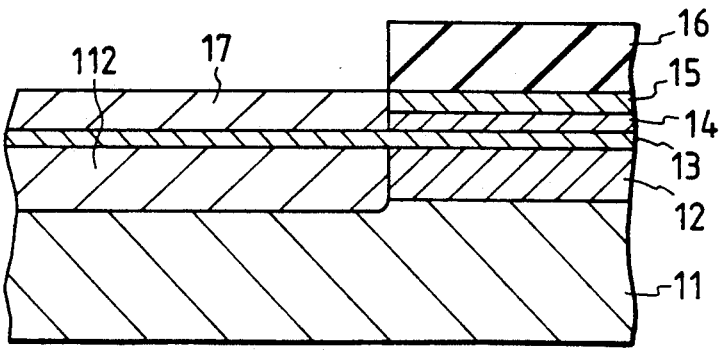

Next, an undoped GaAs layer 17 is grown on the external base layer 13 by MOCVD (organometallic CVD) or the like, thereby to bury the emitter layer and the emitter contact layer 15 (FIG. 1(d)). Here, even the emitter contact layer 15 is buried for flattening the front surface of the device. To the accomplishment of that relief of the emitter size effect which is the original object of the present invention, it suffices to bury only the emitter layer 14. In addition, when the side walls of the emitter layer 14 and emitter contact layer 15 are made vertical or inverted-mesa-like by the etching illustrated in FIG. 1(b), the front surface of the device is perfectly flattened by the burying growth based on the aforementioned MOCVD.

Figure 1E:
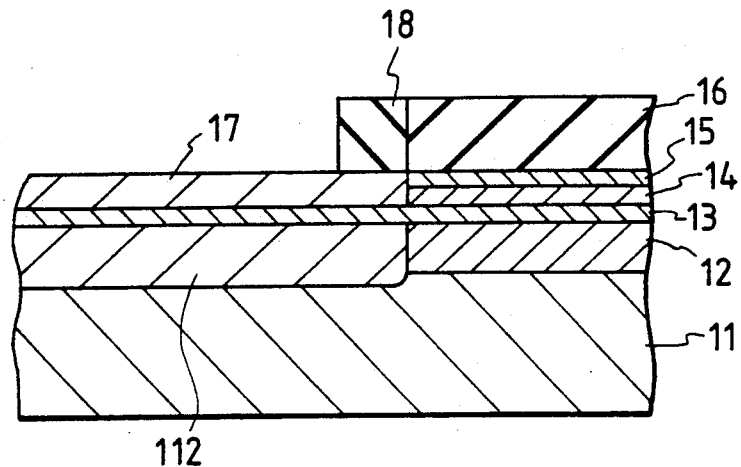
Figure 1F:
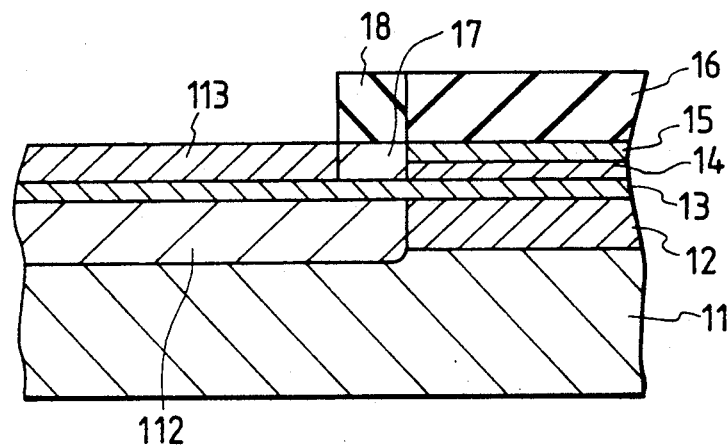

Subsequently, the SiN film mask 16 is formed with a side-wall insulator film 18 of $SiO_2$ (FIG. 1(e)), and using them as a mask, an acceptor impurity such as beryllium (Be) is implanted, whereupon it is activated by predetermined annealing so as to form a base contact layer 113 (FIG. 1(f)).

Next, ohmic electrodes 19 and 110 made of AuGe/Au are respectively formed on the emitter contact layer 15 and the n+-type GaAs substrate 11 to serve as a collector contact layer, and an ohmic electrode 111 made of Au/Zn/Au is formed on the base layer 13, by evaporation and a lift-off method. Then, the heterojunction bipolar transistor of the present invention is finished up (FIG. 1(g)).

When the D.C. current gain of this transistor was measured, a value nearly equal to that in the case of a large area was obtained even in case of a small emitter size. It has accordingly been found that the emitter size effect is sufficiently relieved.

Figure 1G:
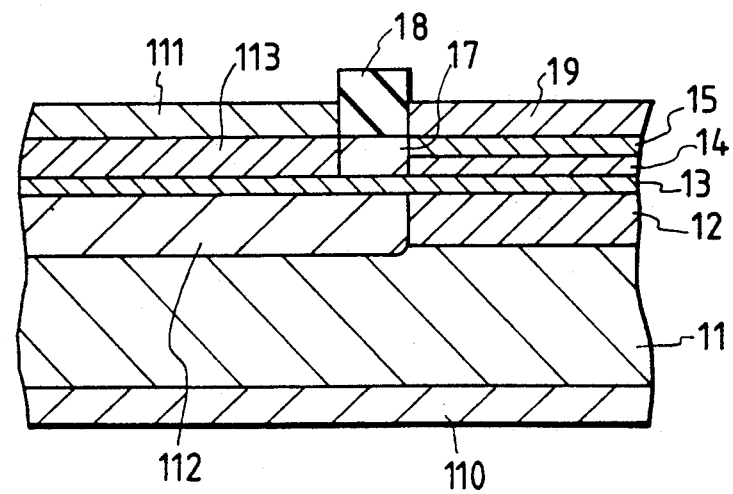

Besides, the heterojunction bipolar transistor of this embodiment has its feature in that, as shown in FIG. 1(g), the front surface of the base and the surface of the emitter-base junction are covered with the high-resistivity epitaxial layer 17 made of the same compound semiconductor as that of the base.

Embodiment 2: In Embodiment 1, the collector is led out from the rear surface of the n+-type GaAs substrate, whereas in Embodiment 2, a collector is led out from the same ride as that of an emitter or a base. Now, this embodiment will be described with reference to FIG. 2. On a semi-insulating GaAs substrate 21 and in the same manner as in Embodiment 1, there are successively grown an n+-type GaAs collector contact layer 22, an n-type GaAs collector layer 23, a p+-type GaAs base layer 24, an n-type AlGaAs emitter layer 25 and an n+-type GaAs emitter contact layer 26 which are the constituent portions of a transistor. Thereafter, an emitter electrode 211 and a base electrode 212 are formed via the steps of FIGS. 1(a)-1(g) illustrated in Embodiment 1. Here, a collector electrode 214 is formed after an n+-type collector lead-out portion 213 has been formed by etching a high-resistivity epitaxial layer 27 as well as the base layer 24 and ion-implanting a donor impurity such as Si. Numeral 29 in FIG. 2 indicates the part of the collector layer rendered insulating, and numeral 210 a base contact layer.

With this transistor, the same effect as in Embodiment 1 is attained.

Moreover, in this embodiment, the emitter electrode 211, base electrode 212 and collector electrode 214 are formed on the front surface of the device, so that the versatility of circuit designs is high.

Figure 2:
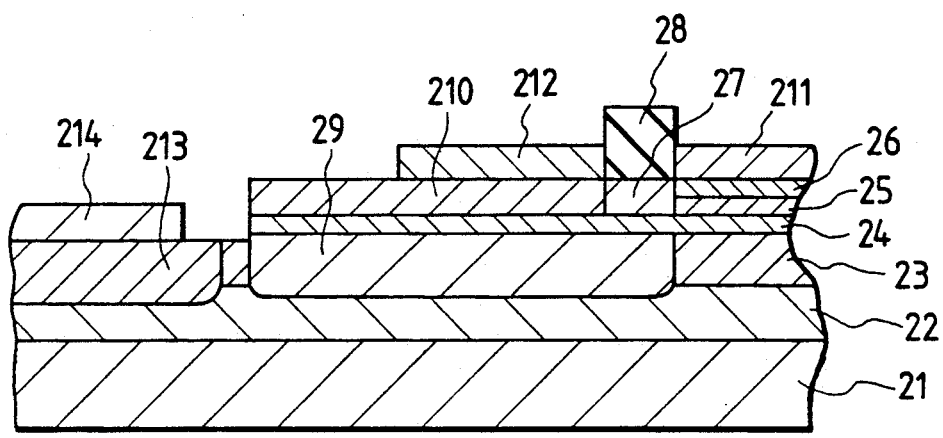
FIG. 2 is a sectional view of a semiconductor device in Embodiment 2 of the present invention.
Figure 3:
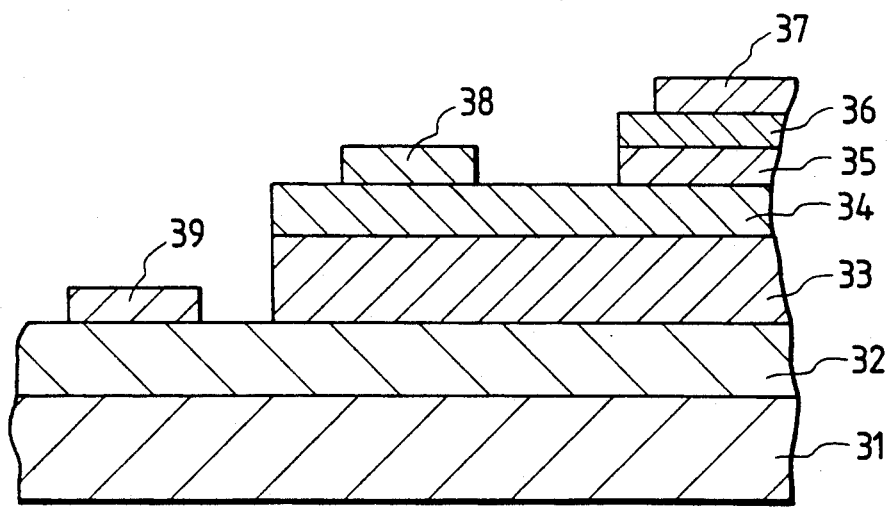
FIG. 3 is a sectional view of a prior-art semiconductor device.

In a case where the isolation of the high-resistivity epitaxial layer 17 or 27 in Embodiment 1 or 2 stated above is insufficient, the $SiO_2$ film 18 or an $SiO_2$ film 28 is removed after the formation of the emitter and base electrodes (FIG. 1(g) or FIG. 2), and the ion implantation of proton, boron, oxygen or the like is carried out using the electrodes 19, 111 or 211, 212 as a mask, whereby the effect of the isolation of the high-resistivity epitaxial layer 17 or 27 can be more enhanced.

Besides, although the epitaxial layer (a single crystal) has been employed as the high-resistivity semiconductor layer in Embodiments 1 and 2 stated above, it may well be replaced with an amorphous layer or a polycrystalline layer. In this case, the insulation between the emitter and the base is enhanced.

According to the present invention, recombinations in the surface of a base-emitter junction can be remarkably reduced, so that the emitter size effect can be removed. In addition, an emitter-base parasitic capacitance can be lowered, and the implementation of a planar structure is possible. Accordingly, a heterojunction bipolar transistor capable of higher-speed operation can be realized owing to the microfabrication of the device.

Besides, since an emitter-base distance is shortened by utilizing a side-wall insulator film, the resistance of a base can be lowered with a favorable controllability. Further, since an acceptor impurity is implanted into an undoped GaAs layer, a base lead-out portion which is stable and which is of lower resistance can be formed. Owing to such lowering in the base resistance, a heterojunction bipolar transistor having an excellent high-frequency response has been realized.

What is claimed is:

1. A method of manufacturing a heterojunction bipolar transistor, comprising the steps of:
   forming a collector layer, base layer and emitter layer in order on a semiconductor substrate;
   forming an insulating film on a designated emitter region of said emitter layer;

forming said emitter region by etching, using said insulating film as a mask, so as to expose an outer base region of the base layer;

depositing a layer of a high resistivity undoped compound-semiconductor material on said outer base region so as to bury the emitter region, the layer of high resistivity undoped compound-semiconductor material contacting said emitter region, wherein the layer of high resistivity undoped compound-semiconductor material contains at least one element contained in both said emitter layer and said base layer as a constituent element thereof;

forming said insulating film with a side-wall insulator film;

forming a base contact layer by ion-implantation of an impurity exhibiting a same conductivity type as that of said base layer into said layer of high resistivity undoped compound-semiconductor material, using said insulating film and said side-wall insulator film as a mask; and forming an emitter electrode, a base electrode and a collector electrode on said emitter region, said base region and said semiconductor substrate, respectively.

2. A method of manufacturing a heterojunction bipolar transistor according to claim 9, including a further step of forming an emitter contact layer on said emitter layer before forming said insulating film, said insulating film being formed on the emitter contact layer, and wherein the emitter contact layer is etched, using said insulating film as a mask, so as to form an emitter contact region on the emitter region.

3. A method of manufacturing a heterojunction bipolar transistor according to claim 10, including a further step of rendering a part of said collector layer, underlying said outer base region, insulating, by ion-implantation using said insulating film as a mask, before said step of forming said high resistivity undoped compound-semiconductor material.

4. A method of manufacturing a heterojunction bipolar transistor according to claim 3, wherein ions implanted in said ion-implantation are at least one selected from a group consisting of proton, boron and oxygen.

5. A method of manufacturing a heterojunction bipolar transistor according to claim 3, wherein said semiconductor substrate consists of n+-type GaAs, said collector layer consists of n-type GaAs, said base layer consists of p+-type GaAs, said emitter layer consists of n-type AlGaAs, said emitter contact layer consists of n+-type GaAs and said high resistivity undoped compound-semiconductor layer consists of undoped GaAs.

6. A method of manufacturing a heterojunction bipolar transistor according to claim 2, wherein the layer of high resistivity undoped compound-semiconductor material is formed so as to bury both the emitter region and emitter contact region.

7. A method of manufacturing a heterojunction bipolar transistor according to claim 6, wherein the layer of high resistivity undoped compound-semiconductor material has a top surface, and is formed such that the top surface thereof is in a same plane as a top surface of the emitter contact region.

8. A method of manufacturing a heterojunction bipolar transistor according to claim 1, wherein the layer of high resistivity undoped compound-semiconductor material has a top surface, and is formed such that the top surface thereof is in a same plane as a top surface of the emitter region.

9. A method of manufacturing a heterojunction bipolar transistor according to claim 1, wherein the same compound-semiconductor material is used for the base layer and for the layer of high resistivity undoped compound-semiconductor material.

10. A method of manufacturing a heterojunction bipolar transistor according to claim 1, wherein the base layer and emitter layer are formed of different semiconductor materials so as to provide a heterojunction therebetween.

11. A method of manufacturing a heterojunction bipolar transistor according to claim 10, wherein the different semiconductor materials are different compound-semiconductor materials.

12. A method of manufacturing a heterojunction bipolar transistor according to claim 1, including further steps of:

removing said side-wall insulator film after the formation of said emitter and base electrodes; and carrying out non-implantation into said layer of high resistivity undoped compound-semiconductor material, using said emitter and base electrodes as a mask to enhance the effect of the isolation of said material of high resistivity undoped compound-semiconductor material, after said removal of said side-wall insulator layer.

13. A method of manufacturing a heterojunction bipolar transistor according to claim 12, wherein an ion implanted in said ion-implantation is at least one selected from a group consisting of proton, boron and oxygen.

14. A method of manufacturing a heterojunction bipolar transistor according to claim 1, wherein said layer of high resistivity undoped compound-semiconductor material is selected from a group consisting of single crystal, polycrystalline and amorphous.

15. A method of manufacturing a heterojunction bipolar transistor according to claim 14, including further steps of:

removing said side-wall insulator film after the formation of said emitter and base electrodes; and carrying out ion-implantation into said layer of high resistivity undoped compound-semiconductor material using said emitter and base electrodes as a mask, to enhance the effect of the isolation of said layer of high resistivity undoped compound-semiconductor material, after said removal of said side-wall insulator layer.

16. A method of manufacturing a heterojunction bipolar transistor according to claim 15, wherein an ion implanted in said ion-implantation is at least one selected from a group consisting of proton, boron and oxygen.

17. A method of manufacturing a heterojunction bipolar transistor according to claim 1, wherein the layer of high resistivity undoped compound-semiconductor material is deposited so as to bury a junction between the emitter region and a part of the base layer other than the outer base region.

18. A method of manufacturing a heterojunction bipolar transistor according to claim 17, wherein the layer of high resistivity undoped compound-semiconductor material is deposited so as to cover the outer base region.

19. A method of manufacturing a heterojunction bipolar transistor according to claim 1, wherein the layer of high resistivity undoped compound-semiconductor material is deposited so as to cover the outer base region.

20. A method of manufacturing a heterojunction bipolar transistor according to claim 1, wherein the ion-implantation is performed, in forming the base contact layer, so as to convert portions of the layer of high resistivity undoped compound-semiconductor material, ion-implanted with said impurity, into said base contact layer.

21. A method of manufacturing a heterojunction bipolar transistor, comprising the steps of:
   forming a collector contact layer, a collector layer, a base layer and an emitter layer in order on a semi-insulating semiconductor substrate;
   forming an insulating film on a designated emitter region of said emitter layer;
   forming said emitter region by etching, using said insulating film as a mask, so as to expose an outer base region of the base layer;
   depositing a layer of a high resistivity undoped compound-semiconductor material on said outer base region so as to bury said emitter region, the layer of high resistivity undoped compound-semiconductor material contacting said emitter region, wherein the layer of high resistivity undoped compound-semiconductor material contains at least one element contained in both said emitter layer and said base layer as a constituent element thereof;
   forming said insulating film with a side-wall insulator film;
   forming a base contact layer by ion-implantation of an impurity exhibiting a same conductivity type as that of said base layer into said layer of high resistivity undoped compound-semiconductor material, using said insulating film and said side-wall insulator film as a mask;
   removing a desired region of said material of high resistivity undoped compound semiconductor material and said outer base layer to form a collector lead-out portion;
   forming said collector lead-out portion by ion-implantation of an impurity exhibiting a same conductivity type as that of said collector layer into said collector layer; and
   forming an emitter electrode, a base electrode and a collector electrode on said emitter region, said base region and said collector lead-out portion, respectively.

22. A method of manufacturing a heterojunction bipolar transistor according to claim 21, including a further step of forming an emitter contact layer on said emitter layer before forming said insulating film, said insulating film being formed on the emitter contact layer, and wherein the emitter contact layer is etched, using said insulating film as a mask so as to form an emitter contact region on the emitter region.

23. A method of manufacturing a heterojunction bipolar transistor according to claim 22, including a further step of rendering a part of said collector layer, underlying said outer base region, insulating, by ion-implantation using said insulating film as a mask, before said step of forming said layer of high resistivity undoped compound-semiconductor material.

24. A method of manufacturing a heterojunction bipolar transistor according to claim 23, wherein ions implanted in said ion-implantation are at least one selected from a group consisting of proton, boron and oxygen.

25. A method of manufacturing a heterojunction bipolar transistor according to claim 23, wherein the layer of high resistivity undoped compound-semiconductor material is formed so as to bury both the emitter region and emitter contact region.

26. A method of manufacturing a heterojunction bipolar transistor according to claim 25, wherein the layer of high resistivity undoped compound-semiconductor material has a top surface, and is formed such that the top surface thereof is in a same plane as a top surface of the emitter contact region.

27. A method of manufacturing a heterojunction bipolar transistor according to claim 21, wherein the layer of high resistivity undoped compound-semiconductor material has a top surface, and is formed such that the top surface thereof is in a same plane as a top surface of the emitter region.

28. A method of manufacturing a heterojunction bipolar transistor according to claim 21, wherein said semi-insulating semiconductor substrate consists of semi-insulating GaAs, said collector lead-out portion consists of n+-type GaAs, said collector layer consists of n-type GaAs, said base layer consists of p+-type GaAs, said emitter layer consists of n-type AlGaAs, said emitter contact layer consists of n+-type GaAs and said layer of high resistivity undoped compound-semiconductor material consists of undoped GaAs.

29. A method of manufacturing a heterojunction bipolar transistor according to claim 21, wherein the layer of high resistivity undoped compound-semiconductor material is selected from a group consisting of single crystal, polycrystalline and amorphous.

30. A method of manufacturing a heterojunction bipolar transistor according to claim 21, wherein the layer of high resistivity undoped compound-semiconductor material is deposited so as to bury a junction between the emitter region and a part of the base layer other than the outer base region.

31. A method of manufacturing a heterojunction bipolar transistor according to claim 21, wherein the layer of high resistivity undoped compound-semiconductor material is deposited so as to cover the outer base region.

32. A method of manufacturing a heterojunction bipolar transistor according to claim 21, wherein the ion-implantation is performed, in forming the base contact layer, so as to convert portions of the layer of high resistivity undoped compound-semiconductor material, ion-implanted with said impurity, into said base contact layer.

* * * * *